United States Patent
Gao

(10) Patent No.: US 9,438,239 B2
(45) Date of Patent: Sep. 6, 2016

(54) LEVEL SHIFTER, DC-DC CONVERTER, AND LEVEL SHIFT METHOD

(71) Applicant: FUJITSU LIMITED, Kawasaki-shi, Kanagawa (JP)

(72) Inventor: Hong Gao, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 160 days.

(21) Appl. No.: 14/455,626

(22) Filed: Aug. 8, 2014

(65) Prior Publication Data

US 2015/0102795 A1 Apr. 16, 2015

(30) Foreign Application Priority Data

Oct. 10, 2013 (JP) .................................. 2013-213144

(51) Int. Cl.
| | |
|---|---|
| *H02M 1/08* | (2006.01) |
| *H03K 19/0185* | (2006.01) |
| *H02M 3/158* | (2006.01) |
| *H02M 1/00* | (2006.01) |

(52) U.S. Cl.
CPC ..... *H03K 19/018507* (2013.01); *H02M 3/158* (2013.01); *H02M 1/08* (2013.01); *H02M 2001/0006* (2013.01)

(58) Field of Classification Search
CPC .................. H03K 5/02; H03K 5/023; H03K 19/018507; H02M 1/08
See application file for complete search history.

(56) References Cited

U.S. PATENT DOCUMENTS

| | | | | | |
|---|---|---|---|---|---|
| 5,243,236 | A | * | 9/1993 | McDaniel | H03K 3/356017 326/68 |
| 5,539,334 | A | * | 7/1996 | Clapp, III | H03K 3/356017 326/30 |
| 7,560,970 | B2 | * | 7/2009 | Cook | H03K 3/35613 326/81 |
| 7,733,126 | B1 | * | 6/2010 | Choy | H03K 19/018521 326/68 |
| 2009/0315609 | A1 | | 12/2009 | Nakazono | |
| 2010/0264977 | A1 | * | 10/2010 | Duby | H03K 19/018507 327/333 |
| 2011/0181338 | A1 | * | 7/2011 | Olson | H03K 19/018521 327/333 |
| 2012/0154014 | A1 | * | 6/2012 | Nakashima | H03K 3/356182 327/333 |

FOREIGN PATENT DOCUMENTS

JP 2010-004198 A 1/2010

OTHER PUBLICATIONS

V. Pinon et al., "A Single-Chip WCDMA Envelope Reconstruction LDMOS PA with 130MHz Siwitched-Mode Power Supply," IEEE International Solid-State Circuits Conference, Feb. 2008, pp. 564-565 & 636.

* cited by examiner

*Primary Examiner* — Harry Behm
(74) *Attorney, Agent, or Firm* — Arent Fox LLP

(57) ABSTRACT

A level shifter includes: a first cascode portion, including a first transistor of a first conductivity type and a second transistor of a second conductivity type which are cascode-coupled to each other, configured to transmit a first input signal; a second cascode portion, including a third transistor of the first conductivity type and a fourth transistor of the second conductivity type which are cascode-coupled to each other, configured to transmit a second input signal; a latch portion configured to retain a first output signal and a second output signal obtained by changing, based on a first voltage obtained by boosting a power supply voltage, potential levels of the first input signal and the second input signal; and a potential-difference suppression circuit, coupled in parallel to the first cascode portion, configured to control a potential difference between source and drain of each of the first transistor and the second transistor.

20 Claims, 11 Drawing Sheets

LEVEL SHIFTER, DC-DC CONVERTER, AND LEVEL SHIFT METHOD

CROSS-REFERENCE TO RELATED APPLICATION

This application is based upon and claims the benefit of priority from the prior Japanese Patent Application No. 2013-213144 filed on Oct. 10, 2013, the entire contents of which are incorporated herein by reference.

FIELD

The embodiments discussed herein are related to a level shifter, a DC (direct current)-DC converter, and a level shift method.

BACKGROUND

A DC-DC converter has two switch elements which are cascode-coupled between a power supply and the ground and performs DC-DC conversion by turning the two switch elements on and off in a complementary manner. As these two switch elements, N-channel metal-oxide semiconductor field effect transistors (MOSFETs) are used. An N-channel MOSFET has a lower on-resistance and a smaller parasitic capacitance (a smaller amount of capacitance charging and discharging) than a p-channel MOSFET.

Related techniques are disclosed in Japanese Laid-open Patent Publication No. 2010-4198 and a non-patent document: V. Pinon et al. (STMicroelectronics), "A Single-Chip WCDMA Envelope Reconstruction LDMOS PA with 130 MHz Switched-Mode Power Supply", ISSCC Dig. Tech. Papers, pp. 564-565, February 2008.

SUMMARY

According to an aspect of the embodiment, a level shifter includes: a first cascode portion, including a first transistor of a first conductivity type and a second transistor of a second conductivity type which are cascode-coupled to each other, configured to transmit a first input signal; a second cascode portion, including a third transistor of the first conductivity type and a fourth transistor of the second conductivity type which are cascode-coupled to each other, configured to transmit a second input signal which is in a complementary relation with the first input signal; a latch portion configured to retain a first output signal and a second output signal obtained by changing, based on a first voltage obtained by boosting a power supply voltage, potential levels of the first input signal and the second input signal; and a potential-difference suppression circuit, coupled in parallel to the first cascode portion, configured to control a potential difference between a source and a drain of each of the first transistor and the second transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A potential at a source of one of two switch elements which is coupled to the power supply side (called a high-side switch hereinbelow) changes from 0 V to a power supply voltage. In order to drive the high-side switch, a level shifter and a booster circuit, for example, a bootstrap circuit, are used to change a control signal (gate signal) to a voltage larger than the power-supply voltage.

For example, the voltage exceeding the power-supply voltage and applied to a transistor included in the level shifter may exceed a breakdown voltage of the transistor. Therefore, if a transistor with a high withstanding voltage is used, manufacture costs might increase.

Figure 1:
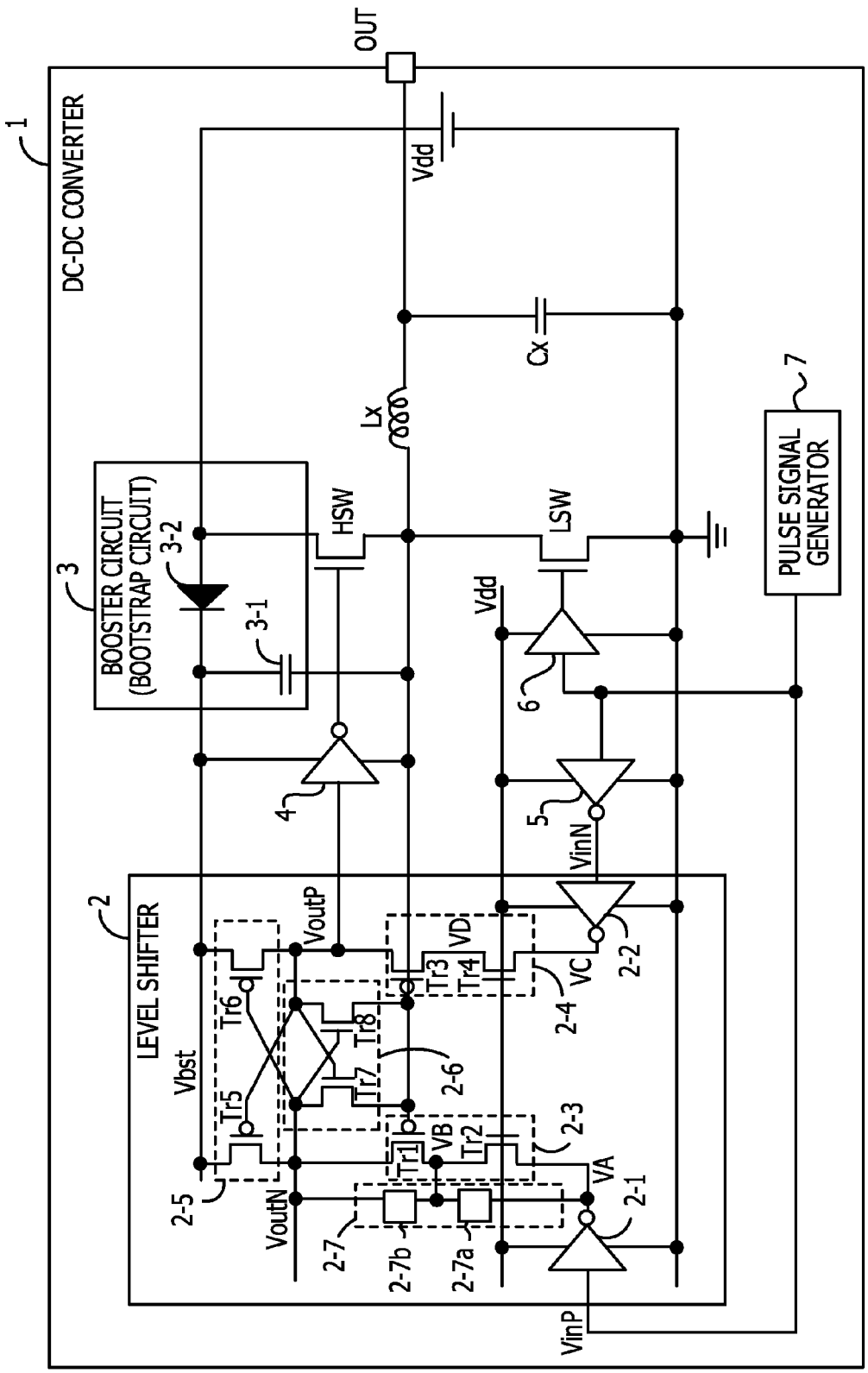
FIG. 1 illustrates an example of a DC-DC converter.

FIG. 1 illustrates an example of a DC-DC converter. A DC-DC converter 1 may be a buck circuit, and includes a level shifter 2, a booster circuit 3, inverters 4 and 5, a buffer 6, a pulse signal generator 7, a high-side switch HSW, a low-side switch LSW, a coil Lx, and a capacitive element Cx.

The high-side switch HSW and the low-side switch LSW may be n-channel MOSFETs, and are cascode-coupled between a power supply and the ground. Via the coil Lx, an output terminal OUT and one terminal of the capacitive element Cx are coupled to a midpoint between the high-side switch HSW and the low-side switch LSW. The other terminal of the capacitive element Cx is coupled to ground.

An output signal VoutP of the level shifter 2 is input as a control signal to a gate of the high-side switch HSW via the inverter 4. A pulse signal generated by the pulse signal generator 7 is input as a control signal to a gate of the low-side switch LSW via the buffer 6. The inverter 4 may operate at a voltage obtained by boosting Vdd (power-supply voltage) in the booster circuit 3. The buffer 6 may operate at Vdd.

The level shifter 2 changes the potential level of the control signal to the high-side switch HSW by receiving the voltage obtained by the booster circuit 3 by boosting Vdd and changing the potential level of the pulse signal generated by the pulse signal generator 7.

The level shifter 2 receives an input signal VinP which is the pulse signal generated by the pulse signal generator 7 and an input signal VinN obtained by inverting, in the inverter 5, the logic level of the pulse signal generated by the pulse signal generator 7. For example, the input signal VinP and the input signal VinN may be in a complementarity relation with each other. The inverter 5 may operate at Vdd.

In FIG. 1, the booster circuit 3 may be a bootstrap circuit. The booster circuit 3 includes: a diode 3-2 whose anode is coupled to the power supply and whose cathode is coupled to the level shifter 2; and a capacitive element 3-1 whose one terminal is coupled to the cathode of the diode 3-2 and the other terminal is coupled to the midpoint between the high-side switch HSW and the low-side switch LSW. The booster circuit 3 boosts Vdd when the high-side switch HSW is on.

The level shifter 2 includes input inverters 2-1 and 2-2, cascode portions 2-3 and 2-4, a latch portion 2-5, a transistor pair 2-6, and a potential-difference suppression circuit 2-7.

The input inverter 2-1 inverts the logic level of the input signal VinP, and the input inverter 2-2 inverts the logic level of the input signal VinN. The input inverters 2-1 and 2-2 may operate at Vdd.

The cascode portion 2-3 includes a transistor Tr1 which is a p-channel MOSFET and a transistor Tr2 which is an n-channel MOSFET, the transistors Tr1 and Tr2 being cascode-coupled to each other. The cascode portion 2-3 transmits an input signal VA which is a signal obtained by inverting the logic level of the input signal VinP in the input inverter 2-1.

A source of the transistor Tr1 is coupled to the latch portion 2-5, and a drain of the transistor Tr1 is coupled to a drain of the transistor Tr2. A gate of the transistor Tr1 is coupled to the transistor pair 2-6 and the midpoint between the high-side switch HSW and the low-side switch LSW.

A source of the transistor Tr2 is coupled to an output terminal of the input inverter 2-1, and Vdd is applied to a gate of the transistor Tr2. The cascode portion 2-4 includes a transistor Tr3 which is a p-channel MOSFET and a transistor Tr4 which is an n-channel MOSFET, the transistors Tr3 and Tr4 being cascode-coupled to each other. The cascode portion 2-4 transmits an input signal VC which is a signal obtained by inverting the logic level of the input signal VinN in the input inverter 2-2.

A source of the transistor Tr3 is coupled to the latch portion 2-5, and a drain of the transistor Tr3 is coupled to a drain of the transistor Tr4. A gate of the transistor Tr3 is coupled to the midpoint between the high-side switch HSW and the low-side switch LSW.

A source of the transistor Tr4 is coupled to an output terminal of the input inverter 2-2, and Vdd is applied to a gate of the transistor Tr4. The latch portion 2-5 includes transistors Tr5 and Tr6 which are p-channel MOSFETs. The latch portion 2-5 outputs, as a control signals to the high-side switch HSW, output signals VoutP and VoutN obtained by changing, based on a voltage obtained by boosting Vdd, the potential of the input signal VA or VC transmitted from the cascode portion 2-3 or 2-4, and also retains the output signals VoutP and VoutN. In FIG. 1, the output signal VoutP may be used as the control signal.

Sources of the transistors Tr5 and Tr6 are coupled to the booster circuit 3, and a voltage Vbst is applied to the sources of the transistors Tr5 and Tr6. The voltage Vbst may be a voltage obtained by boosting Vdd, for example, 2Vdd, when the booster circuit 3 performs boosting operation. A drain of the transistor Tr5 is coupled to a gate of the transistor Tr6 and the source of the transistor Tr1 of the cascode portion 2-3. A drain of the transistor Tr6 is coupled to a gate of the transistor Tr5 and the source of the transistor Tr3 of the cascode portion 2-4.

The transistor pair 2-6 has transistors Tr7 and Tr8 which are n-channel MOSFETs. A drain of the transistor Tr7 is coupled to the drain of the transistor Tr5 and the gate of the transistor Tr6 of the latch portion 2-5. A drain of the transistor Tr8 is coupled to the drain of the transistor Tr6 and the gate of the transistor Tr5 of the latch portion 2-5.

The potential-difference suppression circuit 2-7 is coupled in parallel to the cascode portion 2-3, and may suppress a potential difference between the source and the drain of each of the transistors Tr1 and Tr2. In the cascode portion 2-3, the output signal VoutN has a voltage obtained by boosting Vdd, at a falling timing of the input signal VA. If the rate of fall of the output signal VoutN is slower than that of a potential VB at a midpoint between the transistors Tr1 and Tr2, the potential difference between the source and the drain of the transistor Tr1 might increase, resulting in that a drain-source voltage exceeds its breakdown voltage (see FIG. 3). If the rate of fall of the potential VB is slower than that of the input signal VA, the potential difference between the source and the drain of the transistor Tr2 might increase, resulting in that a drain-source voltage exceeds its breakdown voltage (see FIG. 3). Therefore, the potential-difference suppression circuit 2-7 may have a function to reduce increase in the drain-source potential difference (see FIG. 5).

In the potential-difference suppression circuit 2-7, the above function may be implemented by two breakdown-voltage protection elements 2-7a and 2-7b. The breakdown-voltage protection elements 2-7a and 2-7b may, for example, each be a capacitive element or multiple diodes coupled in series.

When capacitive elements are used as the breakdown-voltage protection elements 2-7a and 2-7b (see FIG. 4), the capacitive elements adjust the rate of fall of the potential of the output signal VoutN and the potential VB. Thus, the drain-source voltage of each of the transistor Tr1 and Tr2 might not exceed the breakdown voltage.

When diodes are used as the breakdown-voltage protection elements 2-7a and 2-7b (see FIG. 8), the diodes are coupled in series, the number of the diodes being determined based on the breakdown voltage of the transistor Tr1 and/or the transistor Tr2. Thus, the diodes are turned on before the drain-source voltage of each of the transistors Tr1 and Tr2 reaches the breakdown voltage, and the diodes thus perform clipping.

Such provision of the potential-difference suppression circuit 2-7 may decrease occurrence of a case where a voltage exceeding a breakdown voltage is applied to the transistors Tr1 and Tr2. For this reason, transistors with a high breakdown voltage do not have to be used as the transistors Tr1 and Tr2, which may decrease the costs for manufacturing the level shifter 2 and the DC-DC converter 1.

Figure 3:
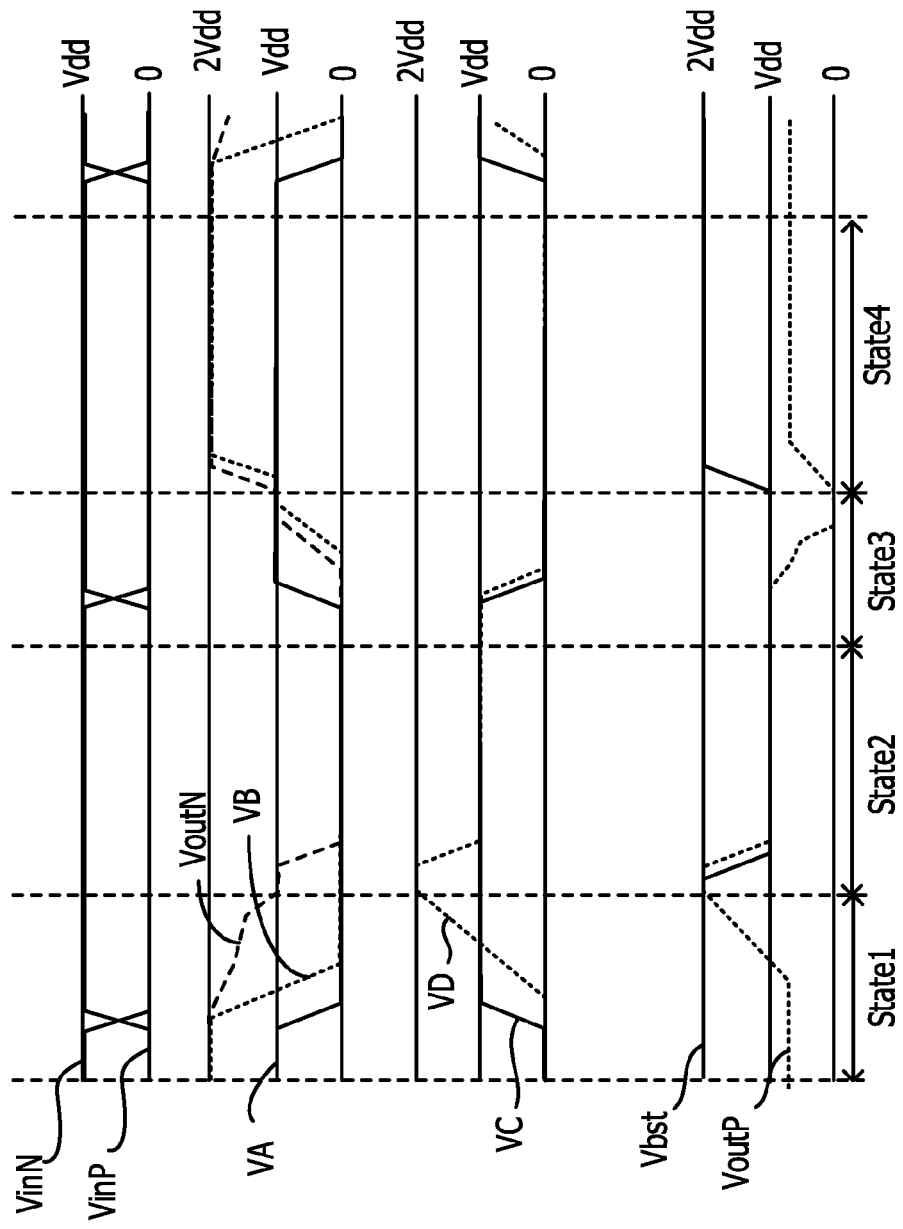
FIG. 3 illustrates an example of an operation of a level shifter.

In the cascode portion 2-4, the output signal VoutP is Vdd at a falling timing of the input signal VC (see FIG. 3). Thus, a potential difference exceeding Vdd might not be applied to the transistors Tr3 and Tr4. For this reason, the potential-difference suppression circuit 2-7 provided to the cascode portion 2-3 does not have to be provided to the cascode portion 2-4.

The provision of the transistor pair 2-6 in which the transistors Tr7 and Tr8 are coupled in the coupled state illustrated in FIG. 1 may decrease occurrence of a case where a voltage exceeding a breakdown voltage is applied to the transistors Tr5 and Tr6 of the latch portion 2-5.

Figure 2:
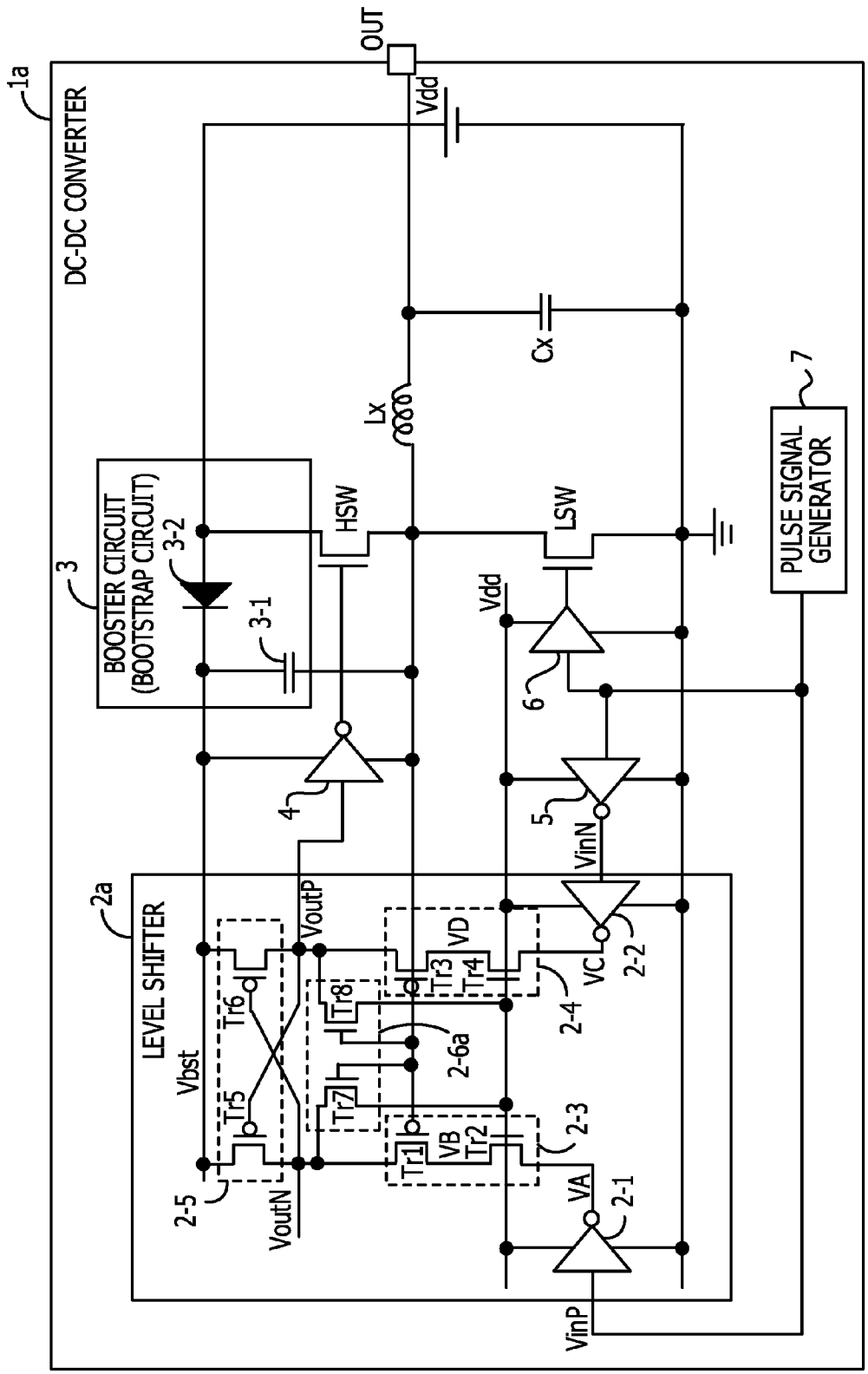
FIG. 2 illustrates an example of a DC-DC converter.

FIG. 2 illustrates an example of a DC-DC converter.

Elements of a DC-DC converter 1a illustrated in FIG. 2 which are substantially the same as or similar to elements of the DC-DC converter 1 illustrated in FIG. 1 are denoted by the same reference numerals, and the description thereof will be omitted or reduces. A level shifter 2a of the DC-DC converter is illustrated in FIG. 2 is not provided with the potential-difference suppression circuit 2-7 illustrated in FIG. 1. A transistor pair 2-6a has a different configuration from the transistor pair 2-6 of the level shifter 2 illustrated in FIG. 1.

One I/O terminal (source or drain) of the transistor Tr7 of the transistor pair 2-6a is coupled between the transistor Tr1 of the cascode portion 2-3 and the transistor Tr5 of the latch portion 2-5. One I/O terminal of the transistor Tr8 is coupled between the transistor Tr3 of the cascode portion 2-4 and the transistor Tr6 of the latch portion 2-5.

Vdd is applied to the other I/O terminals of the transistors Tr7 and Tr8. The gates of the transistors Tr7 and Tr8 are coupled to the midpoint between the high-side switch HSW and the low-side switch LSW (and the coil Lx). The transistor pair 2-6a has a function to reduce increase in the potential difference between the output signal VoutN or VoutP and the boosted voltage Vbst when the output signal VoutN or VoutP transitions.

Other configurations illustrated in FIG. 2 may be substantially the same as or similar to the configuration of the DC-DC converter 1 illustrated in FIG. 1. FIG. 3 illustrates an example of an operation of a level shifter. FIG. 3 illustrates the input signals VinN and VinP, the input signal VA to the cascode portion 2-3, the potential VB at the midpoint between the transistors Tr1 and Tr2, the input signal VC to the cascode portion 2-4, the potential VD at the midpoint between the transistors Tr3 and Tr4, and the output signals VoutN and VoutP, as well as the voltage Vbst supplied to the latch portion 2-5. For example, the booster circuit 3 may boost Vdd to, but not limited to, 2Vdd.

At an initial stage of "State 1", the high-side switch HSW is on so that the voltage Vbst obtained by the booster circuit 3 is 2Vdd. At a falling timing of the input signal VA, the transistors Tr5 and Tr6 are on and off, respectively, and the output signal VoutN and the potential VB are about 2Vdd, while the output signal VoutP is at a potential lower than Vdd.

When the input signal VinP rises from 0 V to Vdd and the input signal VinN falls from Vdd to 0 V, the input signal VA of the cascode portion 2-3 falls from Vdd to 0 V. Thereby, the potential VB starts falling to 0 V with a delay equivalent to a delay by the transistor Tr2. The potential of the output signal VoutN also starts falling, but since the Transistor Tr5 is on, the rate of fall is slower than that of the potential VB.

The input signal VC to the cascode portion 2-4 rises from 0 V to Vdd by the fall of the potential of the input signal VinN, and the potential VD starts rising with a delay equivalent to a delay by the transistor Tr4. As the potential of the output signal VoutN decreases, the transistor Tr6 starts being turned on. Thus, the potential of the output signal VoutP and the potential VD increase up to about 2Vdd.

In "State 2", once the output signal VoutP increases up to about 2Vdd, the transistor Tr5 is turned off. Thus, the output signal VoutN falls at a higher rate down to 0 V. Output of the inverter 4 becomes Low level, and the voltage Vbst falls to Vdd by turning-off of the high-side switch HSW. Thereby, the output signal VoutP also falls to about Vdd.

In "State 3", when the input signal VinP falls from Vdd to 0 V and the input signal VinN rises from 0 V to Vdd, the input signal VA of the cascode portion 2-3 rises from 0 V to Vdd. Subsequently, the potential VB and the potential of the output signal VoutN also start rising.

By the rise of the potential of the input signal VinN, the input signal VC to the cascode portion 2-4 falls from Vdd to 0 V. The potential VD subsequently falls, as well. By the fall of the potential VD, the output signal VoutP also starts falling, but since the transistor Tr6 is on, the rate of the fall is slower that of the potential VD. As the potential of the output signal VoutP decreases, the transistor Tr5 starts being turned on.

In "State 4", when the output signal VoutP reaches about 0 V, output of the inverter 4 becomes High level, turning on the high-side switch HSW so that the booster circuit 3 performs boosting operation. Consequently, the voltage Vbst becomes twice as large as Vdd, and the output signal VoutN and the potential VB also increase to about 2Vdd.

Once the high-side switch HSW is turned on, Vdd is applied to the source of the high-side switch HSW. Thus, Vdd is applied to the gates of the transistors Tr1, Tr3, Tr7, and Tr8. For example, when the output signal VoutP is about 0 V and the output signal VoutN is about Vdd, the transistor Tr3 is off, and the transistors Tr8 and Tr7 of the transistor pair 2-6a are on and off, respectively. Thus, the potential of the output signal VoutP rises via the transistor Tr8 up until it reaches a voltage lower than Vdd by a threshold voltage Vth of the transistor Tr8.

In the operation of the level shifter 2a described above, in "State 1", the falling timing of the potential VB is later than the falling timing of the input signal VA. Hence, a voltage equal to or larger than Vdd may be applied to between the drain and source of the transistor Tr2. The rate of fall of the potential of the output signal VoutN is slower than that of the potential VB. Hence, a voltage equal to or larger than Vdd may be applied to between the drain and source of the transistor Tr1. In this way, in "State 1", a voltage exceeding the breakdown voltage of the transistor Tr1 or Tr2 might be applied.

In "State 4", when the voltage Vbst is 2Vdd, the output signal VoutP is a voltage lower than Vdd by the threshold voltage Vth of the transistor Tr8. Thus, a voltage equal to or larger than Vdd may be applied to between the drain and source of the transistor Tr6 of the latch portion 2-5, and a voltage equal to or larger than Vdd may be applied to between the drain and source of the transistor Tr5 of the latch portion 2-5. In this way, in "State 4", a voltage exceeding the breakdown voltage of the transistor Tr5 or Tr6 of the latch portion 2-5 might be applied.

Figure 4:
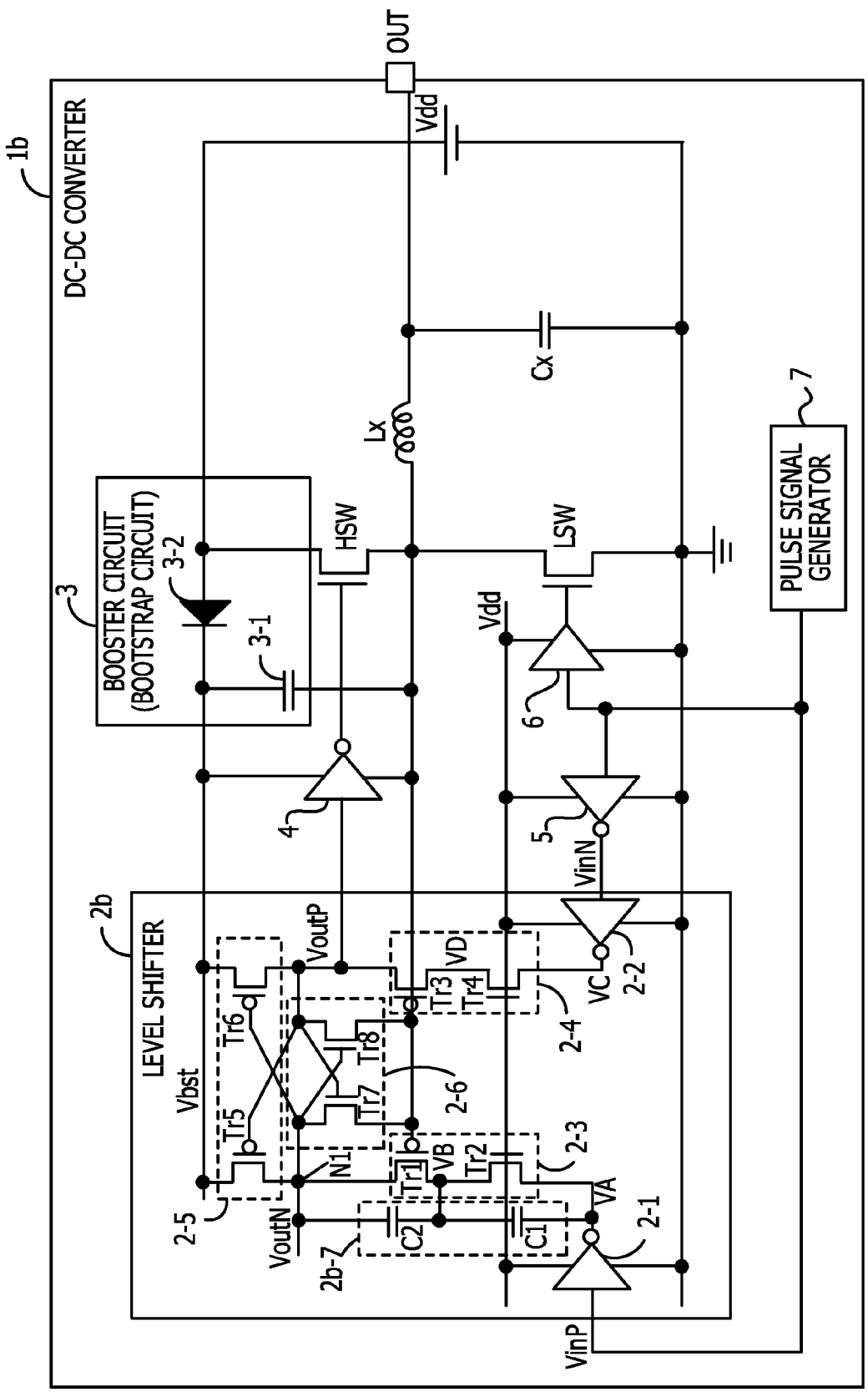
FIG. 4 illustrates an example of a DC-DC converter.

FIG. 4 illustrates an example of a DC-DC converter. The DC-DC converter illustrated in FIG. 4 has a level shifter using capacitive elements as breakdown voltage protection elements.

In a DC-DC converter 1b, a potential-difference suppression circuit 2b-7 of a level shifter 2b has capacitive elements C1 and C2. The capacitive element C1 is coupled between the output terminal of the input inverter 2-1 and the midpoint between the transistors Tr1 and Tr2 of the cascode portion 2-3. The capacitive element C2 is coupled between the drain of the transistor Tr1 and the midpoint between the transistors Tr1 and Tr2 of the cascode portion 2-3.

Figure 5:
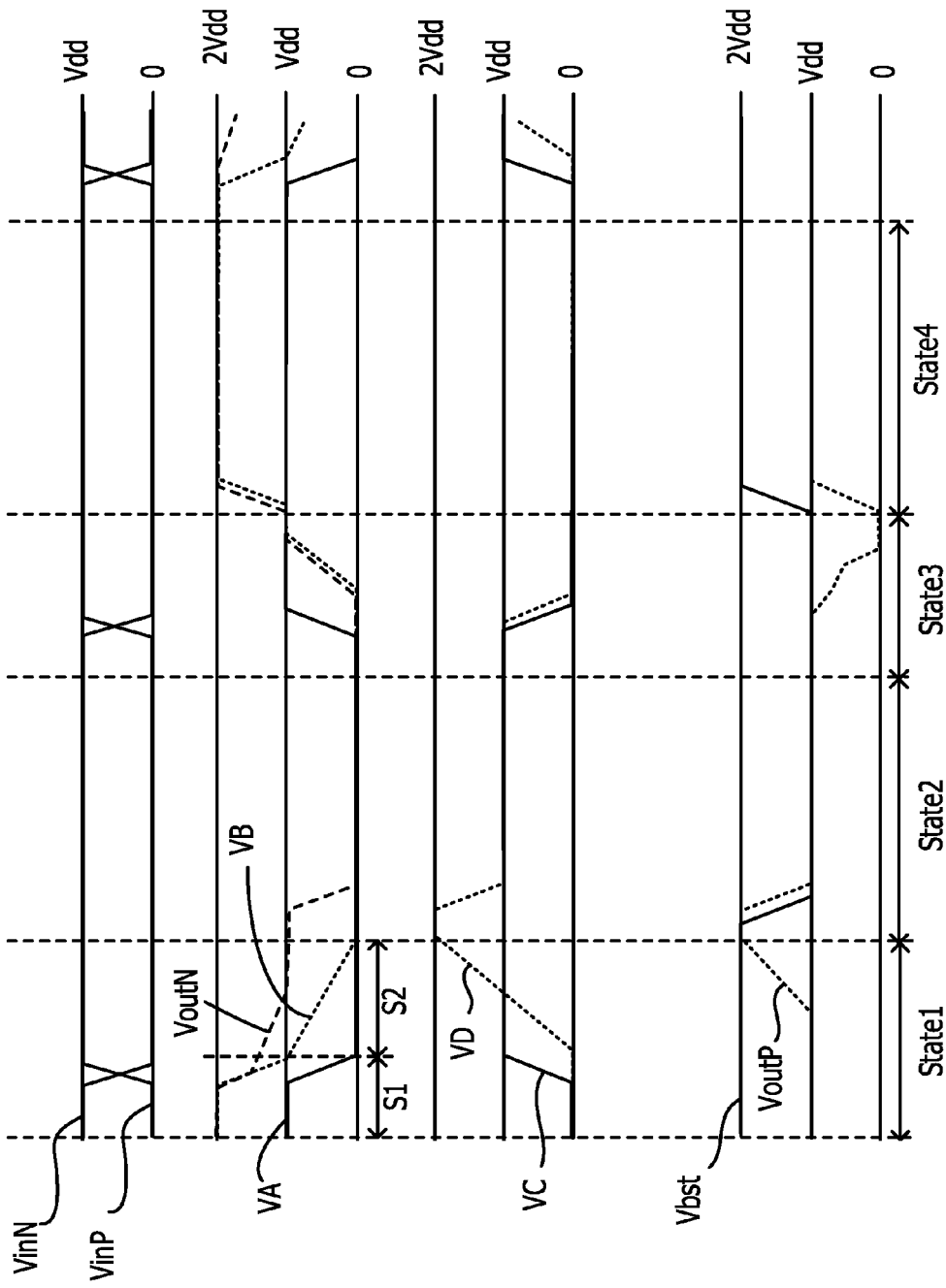
FIG. 5 illustrates an example of an operation of a level shifter.

FIG. 5 illustrates an example of an operation of a level shifter. FIG. 5 illustrates the input signals VinN and VinP, the input signal VA to the cascode portion 2-3, the potential VB at the midpoint between the transistors Tr1 and Tr2, the input signal VC to the cascode portion 2-4, the potential VD at the midpoint between the transistors Tr3 and Tr4, and the output signals VoutN and VoutP, as well as the voltage Vbst supplied to the latch portion 2-5.

In the level shifter 2b illustrated in FIG. 4, "State 1" may be divided into Steps S1 and S2 below:

(Step S1) The potential VB falls from 2Vdd to Vdd almost at the same time that the input signal VA falls, due to feedforward from the capacitive element C1. The capacitance of the capacitive element C1 is set to a certain value, for example, Cmin or larger. Thus, when the potential of the input signal VA is 0 V, the potential VB may be about Vdd.

For this reason, occurrence of a case where a drain-source voltage to the transistor Tr2 exceeds Vdd may be suppressed. Hence, a transistor with a high breakdown voltage might not have to be used as the transistor Tr2. In Step S1, the potential of the output signal VoutN largely falls at almost the same time that the potential VB falls, due to feedforward from the capacitive element C2.

(Step S2) Due to a voltage retaining function of the capacitive element C1, when the voltage VB falls from Vdd to 0 V at a lower rate, the rate of fall of the potential VB decreases. The potential of the output signal VoutN further decreases due to a current source effect of the transistor Tr1 and the capacitive element C2. For this reason, occurrence of a case where a drain-source voltage to the transistor Tr1 exceeds Vdd may be suppressed. Hence, a transistor with a high breakdown voltage might not have to be used as the transistor Tr1.

Figure 6:
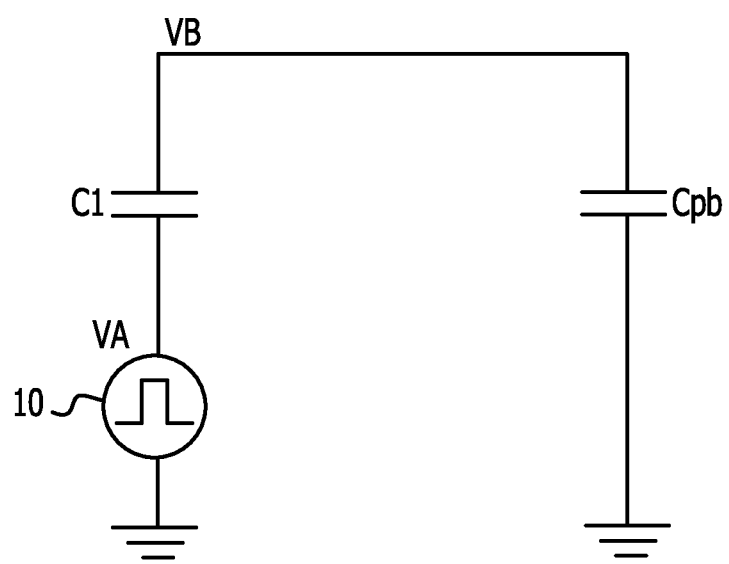
FIG. 6 illustrates an example of a method for determining a capacitance of a capacitive element.

FIG. 6 illustrates an example of a method for setting the capacitance of a capacitive element. The capacitance of the capacitive element C1 may be set in FIG. 6. FIG. 6 illustrates an equivalent circuit of part of the level shifter 2 having a signal source 10 and two capacitive elements C1 and Cpb. The signal source 10 may be an equivalently-illustrated part configured to supply the input signal VA. The capacitive element Cpb is a gate-drain parasitic capacitance of the transistors Tr1 and Tr2.

When Vmax is the breakdown voltage of the transistor Tr2, the condition for the potential VB may be VB Vmax. Assume that, when the potential of the input signal VA falls down to 0 V, $\Delta C_1$ is the amount of change in voltage across the capacitive element C1, and $\Delta C_{pb}$ is the amount of voltage change in voltage across the capacitive element Cpb. Then, under an assumption that the total amount of charge does not change, Formula (1) below is obtained:

$$C_1 \cdot \Delta C_1 = C_{pb} \cdot \Delta C_{pb} \quad (1)$$

where $C_1$ indicates the capacitance of the capacitive element C1, and $C_{pb}$ indicates the capacitance of the capacitive element Cpb. Formula (2) below is obtained by rearranging Formula (1):

$$C_1 = C_{pb} \cdot \Delta C_{pb}/\Delta C_1 = C_{pb} \cdot (2Vdd-VB)/(VB-Vdd). \quad (2)$$

To satisfy the relation VB Vmax, the capacitance $C_1$ only has to satisfy the relation of Formula (3) below:

$$C_1 \geq C_{pb} \cdot (2Vdd-Vmax)/(Vmax-Vdd). \quad (3)$$

"$C_{pb} \cdot (2Vdd-Vmax)/(Vmax-Vdd)$" in the above formula may correspond to Cmin.

Figure 7:
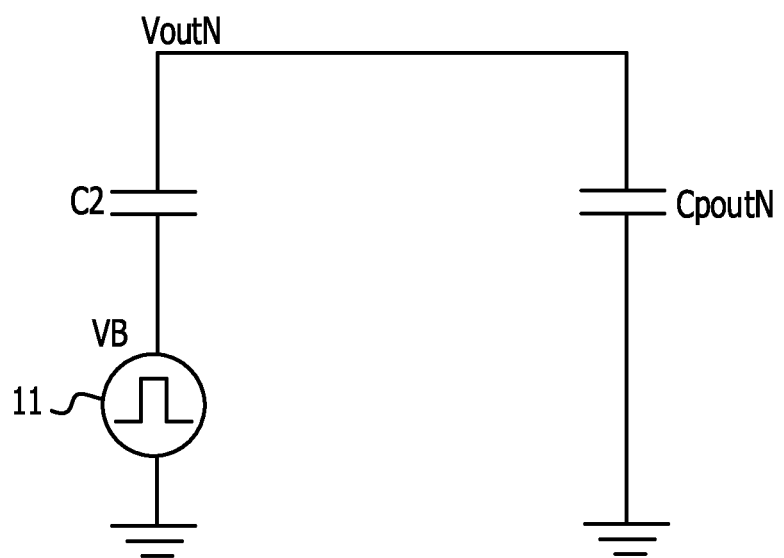
FIG. 7 illustrates an example of a method for determining a capacitance of a capacitive element.

FIG. 7 illustrates an example of a method for setting a capacitance of a capacitive element. The capacitance of the capacitive element C2 may be set in FIG. 7. FIG. 7 illustrates an equivalent circuit of part of the level shifter 2 having a signal source 11 and two capacitive elements C2 and CpboutN. The signal source 11 may be an equivalently-illustrated part configured to generate the potential VB. The capacitive element CpboutN is the parasitic capacitance of the transistors Tr1, Tr5, Tr6, Tr7, and Tr8 which are coupled to a node N1 in FIG. 4.

When the capacitive element C2 is added, the output signal VoutN falls at the same time that the potential VB falls, decreasing the potential difference between the potential VB and the output signal VoutN. Consequently, the transistor Tr1 may be protected so that a drain-source voltage will not exceed the breakdown voltage of the transistor Tr1. The larger the capacitance of the capacitive element C2, the more effective that may be.

However, too large capacitance of the capacitive element C2 makes the falling width of the output signal VoutN large, which may possibly cause the drain-source voltage to the transistor Tr5 or the gate-source voltage to the transistor Tr6 of the latch portion 2-5 to exceed the breakdown voltage. For this reason, when the potential VB falls down to 0 V, the voltage of the output signal VoutN (simply referred to as VoutN hereinbelow) may satisfy the relation of Formula (4) below:

$$VoutN \geq Vbst-Vmax=2Vdd-Vmax. \quad (4)$$

Since the total amount of charge does not change, a capacitance $C_2$ of the capacitive element C2 is expressed as Formula (5) below:

$$C_2 = C_{pboutN} \cdot (2Vdd-VoutN)/VoutN. \quad (5)$$

To satisfy the relation in Formula (4), the capacitance $C_2$ only has to satisfy the relation in Formula (6) below:

$$C_2 \leq C_{pboutN} \cdot Vmax/(2Vdd-Vmax). \quad (6)$$

If the capacitance $C_2$ of the capacitive element C2 is increased, the rate of fall of the potential of the output signal VoutN becomes high, which may possibly protect the transistor Tr1. For example, providing an upper limit to the capacitance $C_2$ as indicated in Formula (6) may decrease occurrence of a case where a drain-source voltage exceeding the breakdown voltage of the transistor Tr5 of the latch portion 2-5 is applied to the transistor Tr5.

The potential-difference suppression circuit 2b-7 includes the capacitive elements C1 and C2. The potential-difference suppression circuit 2b-7 may suppress occurrence of direct current and decrease power consumption. Between "State 3" and "State 4" depicted in FIG. 5, the voltage Vbst and the output signal VoutN are about Vdd, and the output signal VoutP is about 0 V. Thus, the transistors Tr5 and Tr6 are on and off, respectively, and the transistors Tr7 and Tr8 of the transistor pair 2-6 are off and on, respectively. The transistor Tr8 is coupled to the coil Lx. When the output signal VoutP is about 0 V, the high-side switch HSW is turned on, and therefore the voltage at the source of the high-side switch HSW becomes about Vdd. Thus, the output signal VoutP rises to about Vdd. In the transistor pair 2-6 of the level shifter 2b, the gate of the transistor Tr8 is not coupled to the coil Lx, but is coupled so that the output signal VoutN may be input thereto. For this reason, when the transistor Tr8 is on, the output signal VoutP might not fall short of Vdd by the amount of Vth, and therefore the output signal VoutP may be maintained at about Vdd. In "State 4", the potential difference between the voltage Vbst and the output signal VoutP is about Vdd. Hence, occurrence of a case may be suppressed where a voltage exceeding the breakdown voltage is applied to the transistor Tr5 or Tr6 of the latch portion 2-5.

Figure 8:
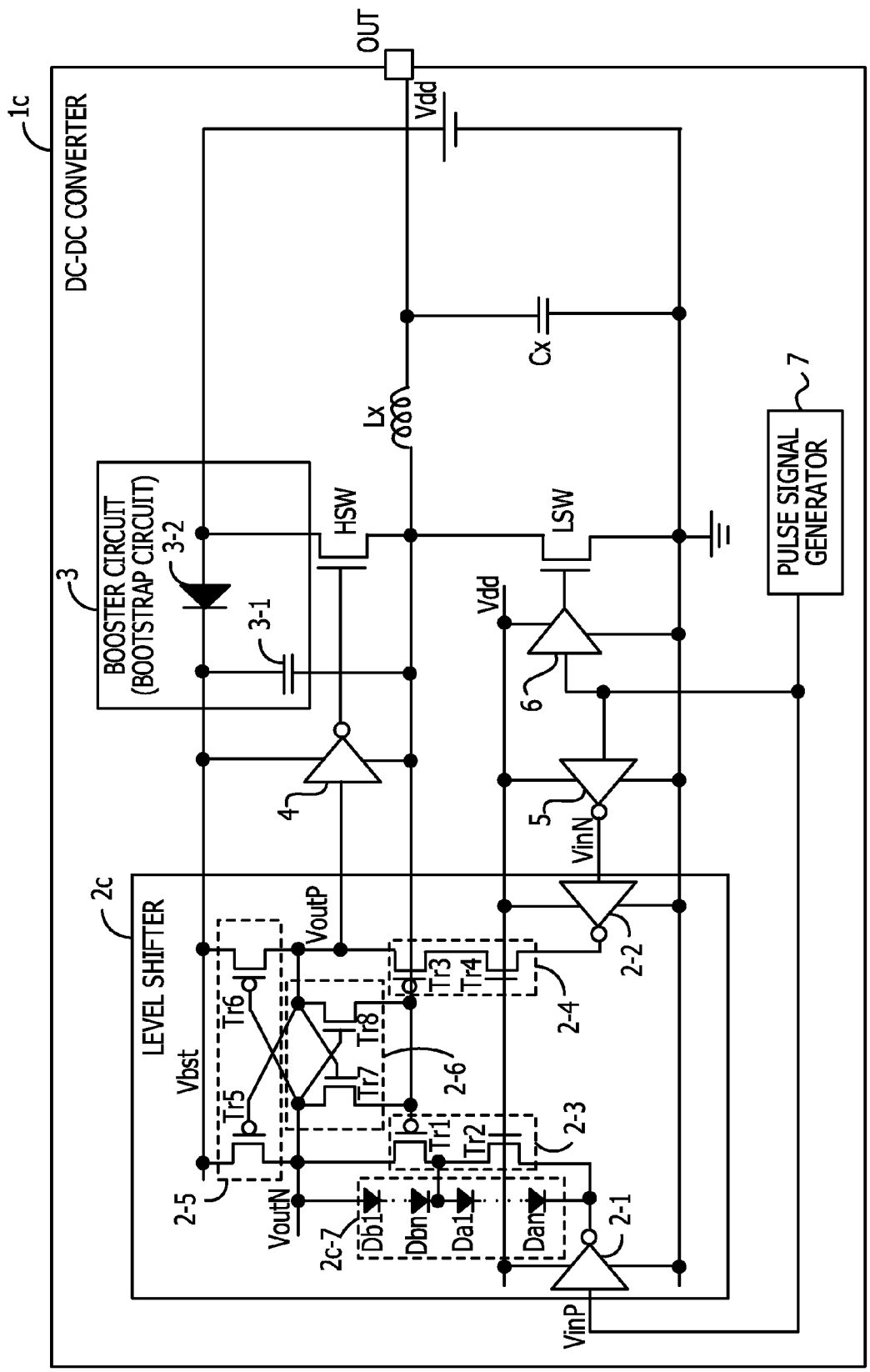
FIG. 8 illustrates an example of a DC-DC converter.

FIG. 8 illustrates an example of a DC-DC converter. The DC-DC converter illustrated in FIG. 8 has a level shifter using diodes as breakdown voltage protection elements.

A potential-difference suppression circuit 2c-7 of a level shifter 2c of a DC-DC converter is includes diodes Da1 to Dan and Db1 to Dbn. The diodes Da1 to Dan are coupled in series between the output terminal of the input inverter 2-1 and the midpoint between the transistors Tr1 and Tr2. The cathode is coupled to the output terminal of the input inverter 2-1, and the anode is coupled to the midpoint between the transistors Tr1 and Tr2.

The diodes Db1 to Dbn are coupled in series between the midpoint between the transistors Tr1 and Tr2 and the drain of the transistor Tr1. The cathode is coupled to the midpoint between the transistors Tr1 and Tr2, and the anode is coupled to the drain of the transistor Tr1.

The number of the diodes Da1 to Dan and Db1 to Dbn may be set according to the breakdown voltage of the transistors Tr1 and Tr2. The number of the diodes Da1 to Dan and that of the diodes Db1 to Dbn may be set to satisfy Formula (7) below:

$$Vdsmax > n \cdot Vf \quad (7)$$

where Vdsmax is the drain-source breakdown voltage of the transistors Tr1 and Tr2, and Vf is a forward voltage of the diodes Da1 to Dan and Db1 to Dbn.

For example, when Vdsmax=5.5 V and Vf=0.6 V, n may be 9. Before a drain-source voltage exceeding the breakdown voltage Vdsmax is applied to the transistor Tr1 or Tr2, the diodes Da1 to Dan and Db1 to Dbn are turned on to possibly protect the transistors Tr1 and Tr2.

Since the potential-difference suppression circuit 2c-7 includes the diodes Da1 to Dan and Db1 to Dbn, the circuit area may be reduced compared to a case using capacitive elements.

Figure 9:
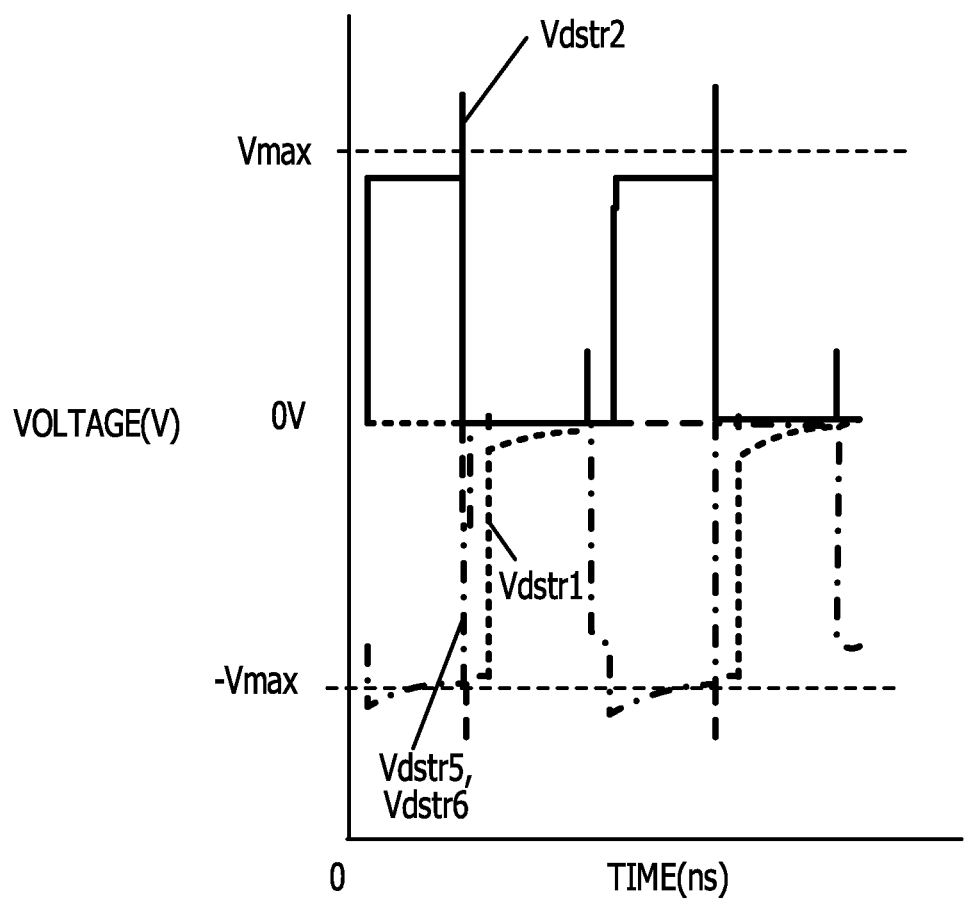
FIG. 9 illustrates an example of result of breakdown-voltage validation for transistors.

FIG. 9 illustrates an example of result of breakdown-voltage validation for transistors. FIG. 9 illustrates a result of withstanding-voltage validation by simulation for the transistors Tr1, Tr2, Tr5, or Tr6 of the level shifter 2a illustrated in FIG. 2. The horizontal axis represents time (ns), and the vertical axis represents voltage (V). FIG. 9 illustrates drain-source voltages Vdstr1, Vdstr2, and Vdstr6 of the transistors Tr1, Tr2, and Tr6 and a gate-source voltage Vgstr5 of the transistor Tr5. Vmax and −Vmax indicate the breakdown voltage of the transistor Tr1, Tr2, Tr5, or Tr6.

As depicted in FIG. 9, in the level shifter 2a, the drain-source voltage Vdstr2 of the transistor Tr2 exceeds the breakdown voltage Vmax. The drain-source voltage Vdstr1 and Vdstr6 of the transistors Tr1 and Tr6 exceed the breakdown voltage −Vmax. The gate-source voltage Vgstr5 of the transistor Tr5 also exceeds the breakdown voltage −Vmax.

Since a voltage exceeding the breakdown voltage Vmax or −Vmax is applied to the transistors Tr1, Tr2, Tr5, and Tr6 of the level shifter 2a, the transistors Tr1, Tr2, Tr5, and Tr6 may break.

Figure 10:
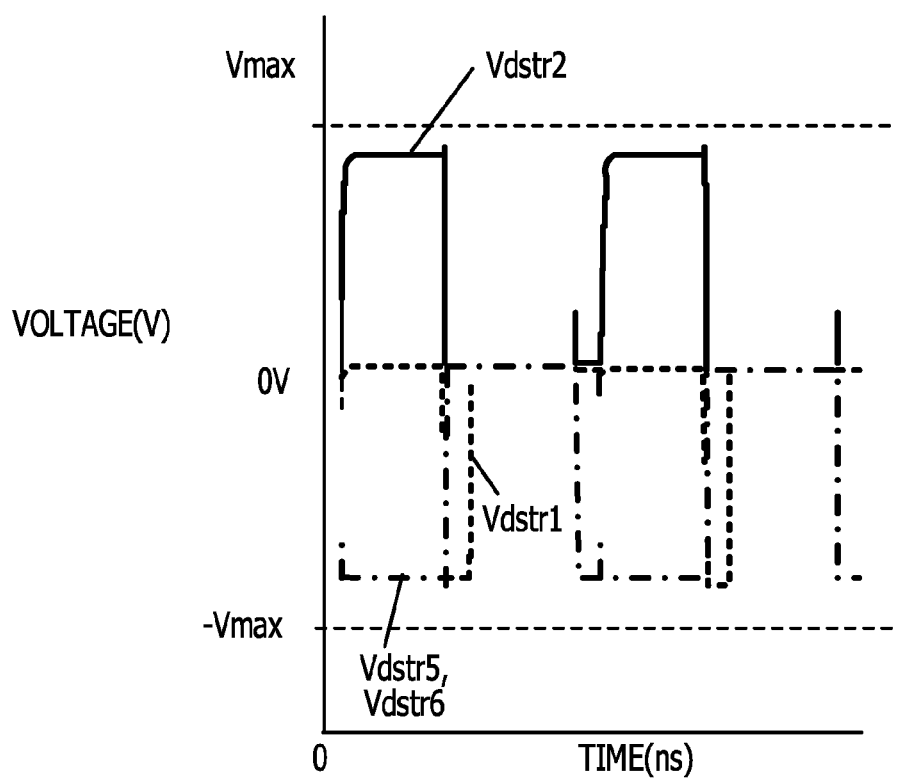
FIG. 10 illustrates an example of result of breakdown-voltage validation for transistors.

FIG. 10 illustrates an example of result of breakdown-voltage validation for transistors. FIG. 10 illustrates a result of breakdown-voltage validation by simulation for the transistors of the level shifter 2b having the potential-difference suppression circuit using capacitive elements. The horizontal axis represents time (ns), and the vertical axis represents voltage (V). Like FIG. 9, FIG. 10 illustrates drain-source voltages Vdstr1, Vdstr2, and Vdstr6 of the transistors Tr1, Tr2, and Tr6 and a gate-source voltage Vgstr5 of the transistor Tr5.

As depicted in FIG. 10, in the level shifter 2b having the potential-difference suppression circuit 2b-7 using the capacitive elements C1 and C2, a voltage exceeding the breakdown voltage Vmax or −Vmax is not applied to the transistors Tr1, Tr2, Tr5, and Tr6. Hence, transistors with a high breakdown voltage might not have to be used.

Figure 11:
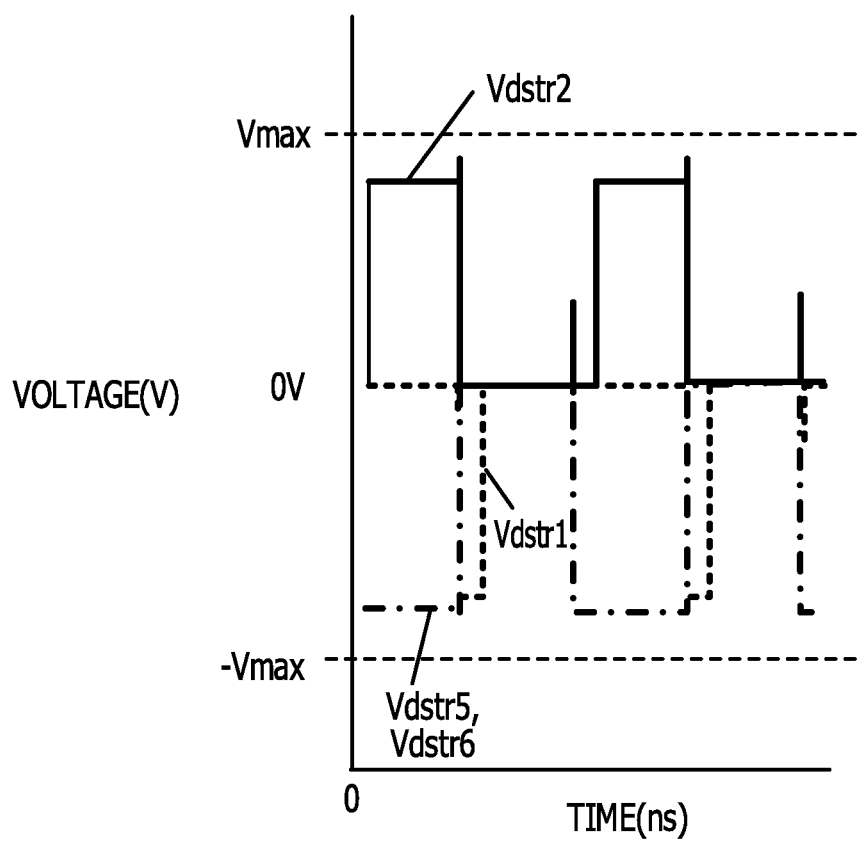
FIG. 11 illustrates an example of result of breakdown-voltage validation for transistors.

FIG. 11 illustrates an example of result of breakdown-voltage validation for transistors. FIG. 11 illustrates a result of breakdown-voltage validation by simulation for the transistors of the level shifter 2c having the potential-difference suppression circuit using diodes. The horizontal axis represents time (ns), and the vertical axis represents voltage (V). Like FIG. 9, FIG. 11 illustrates drain-source voltages Vdstr1, Vdstr2, and Vdstr6 of the transistors Tr1, Tr2, and Tr6 and a gate-source voltage Vgstr5 of the transistor Tr5.

As depicted in FIG. 11, in the level shifter 2c having the potential-difference suppression circuit 2c-7 using the diodes Da1 to Dan and Db1 to Dbn, a voltage exceeding the breakdown voltage Vmax or −Vmax is not applied to the transistors Tr1, Tr2, Tr5, and Tr6. Hence, transistors with a high breakdown voltage might not have to be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A level shifter comprising:
  a first cascode portion, including a first transistor of a first conductivity type and a second transistor of a second conductivity type which are cascode-coupled to each other, configured to transmit a first input signal;
  a second cascode portion, including a third transistor of the first conductivity type and a fourth transistor of the second conductivity type which are cascode-coupled to each other, configured to transmit a second input signal which is in a complementary relation with the first input signal;
  a latch portion configured to retain a first output signal and a second output signal obtained by changing, based on a first voltage obtained by boosting a power supply voltage, potential levels of the first input signal and the second input signal; and
  a potential-difference suppression circuit, coupled in parallel to the first cascode portion, configured to control a potential difference between a source and a drain of each of the first transistor and the second transistor,
  wherein a drain of the first transistor is coupled to a drain of the second transistor at a first node, and the potential-difference suppression circuit includes a first protection element and a second protection element having one terminal coupled to one terminal of the first protection element at a second node which is coupled to the first node.

2. The level shifter according to claim 1, wherein the second output signal output from a node between the first cascode portion and the latch portion has the first voltage at a falling timing of the first input signal input to the first cascode portion.

3. The level shifter according to claim 1, wherein the potential-difference suppression circuit controls a potential difference between a potential of the second output signal and a midpoint potential of the first transistor and the second transistor or a between potential difference between a potential of the first input signal and the midpoint potential.

4. The level shifter according to claim 1, wherein the first protection element and the second protection element are capacitive elements or diodes.

5. The level shifter according to claim 4, wherein the first protection element corresponds to a first capacitive element and the second protection element corresponds to a second capacitive element, and the first capacitive element causes a midpoint potential at the first node to fall at a falling timing of the first input signal, and the second capacitive element causes a potential of the second output signal to fall at a falling timing of the midpoint potential.

6. The level shifter according to claim 4, wherein the first protection element corresponds to a first capacitive element and the second protection element corresponds to a second capacitive element, and a capacitance of the first capacitive element is set based on the power supply voltage as well as a parasitic capacitance and a breakdown voltage of the first transistor and the second transistor.

7. The level shifter according to claim 4, wherein the first protection element corresponds to a first capacitive element and the second protection element corresponds to a second capacitive element, and a capacitance of the second capacitive element is set based on the power supply voltage, a parasitic capacitance of transistors coupled to a third node between the first cascode portion and the latch portion, and a breakdown voltage of the first transistor and the second transistor.

8. The level shifter according to claim 1, wherein the first protection element corresponds to a first group of serially-coupled diodes and the second protection element corresponds to a second group of serially-coupled diodes, the number of the diodes of each of the first group and the second group being set based on a breakdown voltage of the first transistor and the second transistor.

9. The level shifter according to claim 1, wherein the latch portion includes:
a fifth transistor of the first conductivity type having a source to which the first voltage is applied and a sixth transistor of the first conductivity type having a source to which the first voltage is applied;
a seventh transistor of the second conductivity type having a drain coupled to a drain of the fifth transistor and a gate of the sixth transistor; and
an eighth transistor of the second conductivity type having a drain coupled to a drain of the sixth transistor and a gate of the fifth transistor.

10. The level shifter according to claim 9, wherein the power supply voltage is applied to sources of the seventh transistor and the eighth transistor at a rising timing of the first output signal, and the first output signal becomes the power supply voltage.

11. The level shifter according to claim 1, wherein a fixed voltage is supplied to a gate of one of the first transistor and the second transistor.

12. The level shifter according to claim 1, wherein the potential-difference suppression circuit is provided for only the first cascode portion.

13. A DC-DC converter comprising:
a first n-channel transistor and a second n-channel transistor which are cascode-coupled between a power supply and a ground;
a coil whose one terminal is coupled between the first n-channel transistor and the second n-channel transistor;
a capacitive element whose one terminal is coupled between the other terminal of the coil and an output terminal and whose other terminal is grounded;
a booster circuit configured to generate a first voltage by boosting a power supply voltage; and
a level shifter configured to change a potential level of a control signal that controls the first n-channel transistor, wherein the level shifter comprises:
a first cascode portion, including a first transistor of a first conductivity type and a second transistor of a second conductivity type which are cascode-coupled to each other, configured to transmit a first input signal;

a second cascode portion, including a third transistor of the first conductivity type and a fourth transistor of the second conductivity type which are cascode-coupled to each other, configured to transmit a second input signal which is in a complementary relation with the first input signal;
a latch portion configured to output, as a control signal, a first output signal and a second output signal obtained by changing, based on the first voltage, potential levels of the first input signal and the second input signal; and
a potential-difference suppression circuit, coupled in parallel to the first cascode portion, configured to control a potential difference between a drain and a source of each of the first transistor and the second transistor,
wherein a drain of the first transistor is coupled to a drain of the second transistor at a first node, and the potential-difference suppression circuit includes a first protection element and a second protection element having one terminal coupled to one terminal of the first protection element at a second node which is coupled to the first node.

14. The DC-DC converter according to claim 13, wherein the second output signal output from a node between the first cascode portion and the latch portion has the first voltage at a falling timing of the first input signal input to the first cascode portion.

15. The DC-DC converter according to claim 13, wherein the potential-difference suppression circuit controls a potential difference between a potential of the second output signal and a midpoint potential of the first transistor and the second transistor or a between potential difference between a potential of the first input signal and the midpoint potential.

16. The DC-DC converter according to claim 13, wherein the first protection element and the second protection element are capacitive elements or diodes.

17. The DC-DC converter according to claim 13, wherein the potential-difference suppression circuit includes a first group of serially-coupled diodes and a second group of serially-coupled diodes, the number of the diodes of each of the first group and the second group being set based on a breakdown voltage of the first transistor and the second transistor.

18. The DC-DC converter according to claim 13, wherein the latch portion includes:
a fifth transistor of the first conductivity type having a source to which the first voltage is applied and a sixth transistor of the first conductivity type having a source to which the first voltage is applied;
a seventh transistor of the second conductivity type having a drain coupled to a drain of the fifth transistor and a gate of the sixth transistor; and
an eighth transistor of the second conductivity type having a drain coupled to a drain of the sixth transistor and a gate of the fifth transistor.

19. A level shift method comprising:
receiving a first input signal, at a first cascode portion including a first transistor of a first conductivity type and a second transistor of a second conductivity type which are cascode-coupled to each other;
receiving a second input signal which is in a complementary relation with the first input signal, at a second cascode portion including a third transistor of the first conductivity type and a fourth transistor of the second conductivity type which are cascode-coupled to each other;

outputting a first output signal and a second output signal obtained by changing, based on a first voltage obtained by boosting a power supply voltage, potential levels of the first input signal and the second input signal; and controlling a potential difference between a drain and a source of each of the first transistor and the second transistor, by a potential-difference suppression circuit in which one terminal of a first protection element is coupled to a drain of the first transistor, the other terminal of the first protection element is coupled to a source of the first transistor, one terminal of a second protection element is coupled to a drain of the second transistor, the other terminal of the second protection element is coupled to a source of the second transistor, and the one terminal of the first protection element and the one terminal of the second protection element are coupled to each other, so that the potential difference does not exceed the power supply voltage.

20. The level shift method according to claim 19, further comprising, outputting the second output signal at the first voltage at a falling timing of the first input signal inputting to the first cascode portion.

\* \* \* \* \*